(12) United States Patent
Kawashiri (10) Patent No.: US 6,873,360 B1
(45) Date of Patent: Mar. 29, 2005

(54) SOLID STATE IMAGE PICKUP DEVICE OF GOOD WHITE BALANCE AND CONTROL METHOD THEREOF

(75) Inventor: Kazuhiro Kawashiri, Miyagi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 821 days.

(21) Appl. No.: 09/588,229

(22) Filed: Jun. 6, 2000

(30) Foreign Application Priority Data

Jun. 8, 1999 (JP) .......................................... 11-161247

(51) Int. Cl.[7] .............................................. H04N 5/335
(52) U.S. Cl. ...................... 348/296; 348/297; 348/273
(58) Field of Search ................................. 348/296, 297, 348/273, 223.1, 298, 362, 363, 364, 280; 358/482, 483

(56) References Cited

U.S. PATENT DOCUMENTS

| | | | | |
|---|---|---|---|---|
| 4,007,488 A | * | 2/1977 | Morishita et al. | ........ 348/223.1 |
| 5,105,269 A | * | 4/1992 | Nakamura et al. | .......... 348/162 |
| 5,187,569 A | * | 2/1993 | Tani | ........................... 348/277 |
| 5,745,262 A | * | 4/1998 | Tatsumi | ...................... 358/504 |
| 5,754,229 A | * | 5/1998 | Elabd | .......................... 348/319 |
| 6,002,497 A | * | 12/1999 | Hirama | ....................... 358/514 |

* cited by examiner

Primary Examiner—Tuan Ho
Assistant Examiner—Heather R. Long
(74) Attorney, Agent, or Firm—Arent Fox, PLLC

(57) ABSTRACT

A control method for a solid state image pickup device has: a preliminary trial image pickup step of making a plurality type of photoelectric conversion elements generate and accumulate electric charges during a predetermined charge accumulation time and detecting a charge amount corresponding to an intensity of light of each color; a calculation step of calculating a charge accumulation time of photosensitive conversion elements independently for each color so as to obtain a good white balance, in accordance with the charge amount corresponding to the intensity of light of each color detected by the preliminary trial image pickup step; and a final image pickup step of controlling the charge accumulation time of photosensitive conversion elements independently for each color by using the electronic shutters and a mechanical shutter and through reading electric charges from the photoelectric conversion elements to vertical charge transfer paths, in accordance with the calculated charge accumulation times, and making the plurality type of photoelectric conversion elements generate and accumulate electric charges. An image having a good white balance and an image with good color reproductivity can be obtained by controlling the charge accumulation times of photoelectric conversion elements independently for each color.

8 Claims, 6 Drawing Sheets

SOLID STATE IMAGE PICKUP DEVICE OF GOOD WHITE BALANCE AND CONTROL METHOD THEREOF

This application is based on Japanese Patent Application HEI 11-161247, filed on Jun. 8, 1999, the entire contents of which are incorporated herein by reference.

BACKGROUND OF THE INVENTION a) Field of the Invention The present invention relates to a solid state image pickup device having photoelectric conversion elements and its control method, and more particularly to techniques for controlling charge accumulation times of photoelectric conversion elements.

b) Description of the Related Art

Exposure times (charge accumulation times) of red (R), green (G) and blue (B) pixels of a conventional color solid state image pickup device are controlled uniformly. If an image is picked up under external light having a shifted color temperature, a color balance of the picked-up image becomes poor. For example, if a scene having a high color temperature, i.e., a bluish scene, is taken, although a sufficient signal for B pixels can be obtained, signals for G and R pixels are small. When color image signals having a good white balance are to be obtained from such signals, the dynamic range of the color image is determined basing upon the color signal having the smallest amplitude, in this case, R signal. A reproduced image has a poor color balance in a bright image area, being insufficient for R color and rather having a magenta hue. A reddish scene such as an evening scene has a tendency opposite to that described above.

SUMMARY OF THE INVENTION

It is an object of the present invention to provide a solid state image pickup device and its control method capable of obtaining an image having a good white balance and an image with good color reproductivity, by controlling the charge accumulation times of photoelectric conversion elements independently for each color.

According to one aspect of the present invention, there is provided a control method for a solid state image pickup device having a plurality type of photoelectric conversion elements for converting light of each of a plurality of colors into electric charges, charge read-out region disposed, a mechanical shutter for opening and closing a path of incident light to the plurality type of photoelectric conversion elements, and an electronic shutter for clearing electric charges in each of the plurality type of photoelectric conversion elements, the control method comprising:

a preliminary trial image pickup step of making the plurality type of photoelectric conversion elements generate and accumulate electric charges during a predetermined charge accumulation time and detecting a charge amount corresponding to an intensity of light of each color; a calculation step of calculating a charge accumulation time of photosensitive conversion elements independently for each color so as to obtain a good white balance, in accordance with the charge amount corresponding to the intensity of light of each color detected by the preliminary trial image pickup step; and a final image pickup step of controlling the charge accumulation time of photosensitive conversion elements independently for each color by using the electronic shutter, the mechanical shutter, and read-out of electric charges from the photoelectric conversion elements to the charge transfer paths read-out region, in accordance with the calculated charge accumulation times, and making the plurality type of photoelectric conversion elements generate and accumulate electric charges.

According to another aspect of the present invention, there is provided a solid state image pickup device comprising: a plurality type of photoelectric conversion elements for converting light of each of red, green and blue colors into electric charges, the photoelectric conversion elements being disposed in vertical and horizontal directions in a two-dimensional plane; vertical charge transfer paths for transferring electric charges in the vertical direction; read gates for reading electric charges from the photoelectric conversion elements to the vertical charge transfer paths; a horizontal charge transfer path for transferring electric charges transferred from the vertical charge transfer paths in the horizontal direction; an electronic shutter for clearing electric charges in the plurality type of photoelectric conversion elements; preliminary trial image pickup means for making the plurality type of photoelectric conversion elements generate and accumulate electric charges during a predetermined charge accumulation time and detecting a charge amount corresponding to an intensity of light of each color; calculation mean for calculating a charge accumulation time of photoelectric conversion elements independently for each color so as to obtain a good white balance, in accordance with the charge amount corresponding to the intensity of light of each color detected by the preliminary trial image pickup means; and final image pickup means for controlling the charge accumulation time of photoelectric conversion elements independently for each color by using the electronic shutter, the mechanical shutter, and read-out of electric charges from the photoelectric conversion elements to the vertical charge transfer paths, in accordance with the calculated charge accumulation times, and making the plurality type of photoelectric conversion elements generate and accumulate electric charges.

At the first preliminary trial image pickup stage, the charge accumulation time of photoelectric conversion elements for each color is determined so as to obtain a good white balance. In accordance with each charge accumulation time, the charge accumulation times of the photoelectric conversion elements for respective colors are determined to perform a final image pickup operation.

At the first image pickup stage, the charge accumulation time of photoelectric conversion elements for each color is determined so as to obtain a good white balance. In accordance with each charge accumulation time, the charge accumulation times of the photoelectric conversion elements for respective colors are determined to perform a final image pickup operation. Accordingly, color image signals having a good color reproductivity can be obtained. Since the mechanical shutter and an electronic shutter are used, an image having a wide dynamic range can be obtained.

DETAILED DESCRIPTION OF THE PREFERRED EMBODIMENTS

Figure 5A:
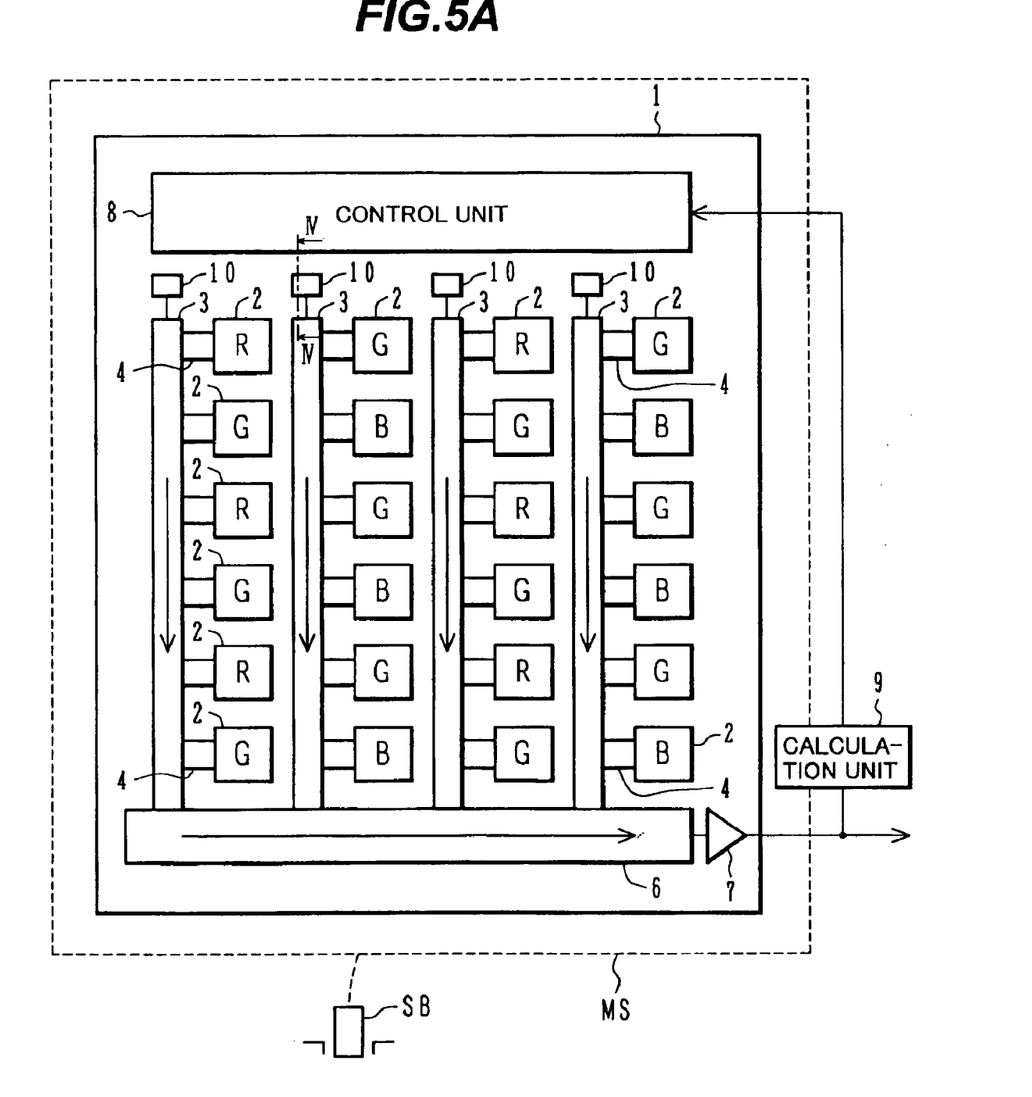
FIG. 5A is a plan view of a solid state image pickup device.

FIG. 5A is a plan view of a color solid state image pickup device according to an embodiment of the invention. The solid image pickup device is formed on a semiconductor substrate 1 made of silicon or the like. The semiconductor substrate 1 has a plurality of photodiodes (photoelectric conversion elements) 2, vertical charge transfer paths (VCCD) 3, transfer gates (read gates) 4, a horizontal charge transfer path (HCCD) 6, an output amplifier 7, drains 10, and a control unit 8, respectively formed on the surface of the semiconductor substrate 1 as one semiconductor chip. The control unit 8 may be formed on a different chip.

The photodiodes are disposed in a two-dimensional matrix shape. Each photodiode converts received light into electric charge and stores the charge. Color filters are disposed on a light reception area of the photodiodes. R represents a photodiode (pixel) with a red filter, G represents a pixel with a green filter, and B represents a pixel with a blue filter. The layout of color pixels shown in FIG. 5A is called a primary color Bayer matrix. In order to make it easy to understand, only 24 pixels are drawn in FIG. 5A. The embodiment is not limited only to 24 pixels, and an actual solid state image pickup device has pixels far more than 24 pixels.

As a mechanical shutter MS disposed above the substrate 1 is opened, external light is incident upon all photodiodes 2. As the mechanical shutter MS is closed, the photodiodes 2 are shielded from the external light. The exposure time (charge accumulation time) of each photodiode 2 starts when the mechanical shutter MS is opened, and ends when it is closed.

Figure 5B:
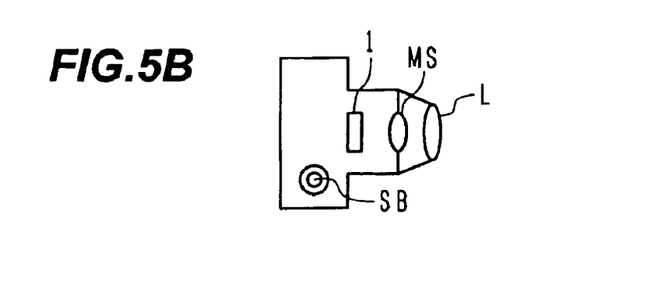
FIG. 5B is a schematic cross sectional view of an electronic still camera.

FIG. 5B is a schematic cross sectional view of an electronic still camera. A lens L mounted on the front of the camera receives external light which forms an image on a semiconductor chip 1 or CCD image pickup device via a mechanical shutter MS. The mechanical shutter MS is controlled by a shutter button SB.

The control unit 8 can drain electric charges in each photodiode 2 to the substrate (collector region) 1 by applying an electronic shutter signal to the substrate. The exposure time of each photodiode 2 can start also by using the electronic shutter signal.

Each vertical charge transfer path 3 is formed on the left side of each column of photodiodes 2 via transfer gates 4. The transfer gate 4 reads electric charges in the corresponding photodiode 2 to the vertical charge transfer path 3.

Electric charges can be read independently for each of three colors RGB. For example, transfer gates 4 can be controlled independently for odd and even columns of each row.

Figure 6:
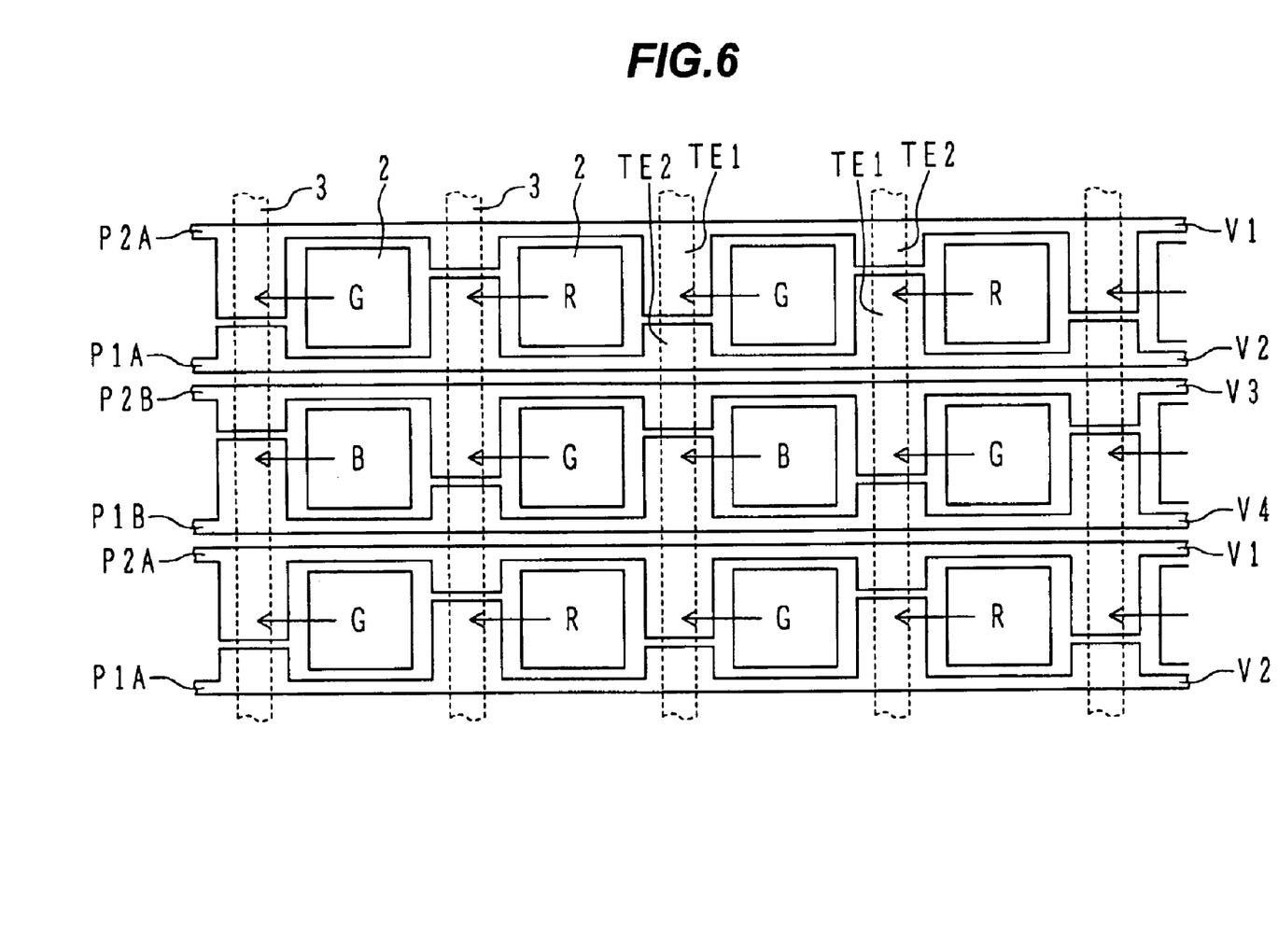
FIG. 6 is a plan view showing an example of transfer electrodes for reading charges independently for odd and even columns.

FIG. 6 shows an example of transfer gates capable of reading electric charges independently for odd and even columns. Photodiodes 2 disposed in a matrix shape and vertical charge transfer paths 3 formed adjacent to each photodiode column are similar to those shown in FIG. 5A.

Electrodes P2A and P1A sandwich one row of photodiodes and constitute adjacent transfer stages on the vertical charge transfer path 3. Electrodes P2B and P1B operate in a manner similar to the electrodes P2A and P1A. The electrodes P1A and P1B are made of a first polysilicon layer, and the electrodes P2A and P2B are made of a second polysilicon layer.

Each electrode has long transfer electrodes TE1 and short transfer electrodes TE2 alternately disposed along the row direction on the respective vertical charge transfer paths 3. Along each vertical charge transfer path, two long transfer electrodes and two short transfer electrodes are alternately disposed, like TE1-TE1-TE2-TE2-TE1-TE1.

As a read voltage is applied to the electrode P2A, accumulated charges are read from G pixels on every second column to corresponding vertical charge transfer paths. Similarly, as a read voltage is applied to the electrode P1A, P2B, or P1B, accumulated charges are read from every second column R, G or B pixels. In summary, the relation between the electrodes and read pixels is given by:

P2A, P2B: G

P1A R

P1B:B.

As a read voltage is applied to the electrode P2A or P2B, one set of G electric charges per four transfer electrodes is read to corresponding vertical charge transfer paths 3. As a read voltage is applied to the electrode P1A or P1B, one set of R or B electric charges per four transfer electrodes is read to corresponding vertical charge transfer paths 3. Read electric charges are transferred in vertical direction in the respective vertical charge transfer paths by applying four-phase drive signals V1, V2, V3 and V4 to the electrodes P2A, P1A, P2B and P1B.

The vertical charge transfer paths 3 are made of charge coupled devices (CCDs) and transfer electric charges read from the photodiodes 2 from the upper area of the drawing of FIG. 5A to the lower area (in a vertical direction). The horizontal charge transfer path 6 is made of a CCD, receives electric charges of one row unit transferred from the vertical charge transfer paths 3 and transfers the charges from the left area of the drawing of FIG. 5A to the right area (in a horizontal direction).

An output amplifier 7 outputs a voltage corresponding to the amount of electric charges transferred from the horizontal charge transfer path 6. This voltage value corresponds to a pixel value. Each photodiode 2 corresponds to a pixel. By disposing the photodiodes two-dimensionally, signals of a two-dimensional image can be obtained.

The control unit 8 controls the transfer gates 4 to read electric charges from photodiodes 2 to the vertical charge transfer paths 3, controls the vertical charge transfer paths 3 and horizontal charge transfer path 6, and/or controls to clear electric charges in each photodiode 2.

Unnecessary electric charges on each vertical charge transfer path 3 can be transferred from the lower area to the upper area and drained to a drain 10 formed at the upper end of the vertical charge transfer path 3.

As a user half-depresses the shutter button SB, the solid state image pickup device performs a tentative image pickup. The output amplifier 7 outputs RGB signals obtained by the tentative image pickup. By using the RGB signals, a calculation unit 9 performs calculations of white balance, automatic exposure and the like. In accordance with the calculation results, exposure times are determined. More specifically, the exposure time is determined independently for each of R, G and B pixels. As the user full-depresses the shutter button SB, a final image pickup is performed by using the determined exposure times. The details of the tentative and final image pickup operations will be described.

Figure 1:
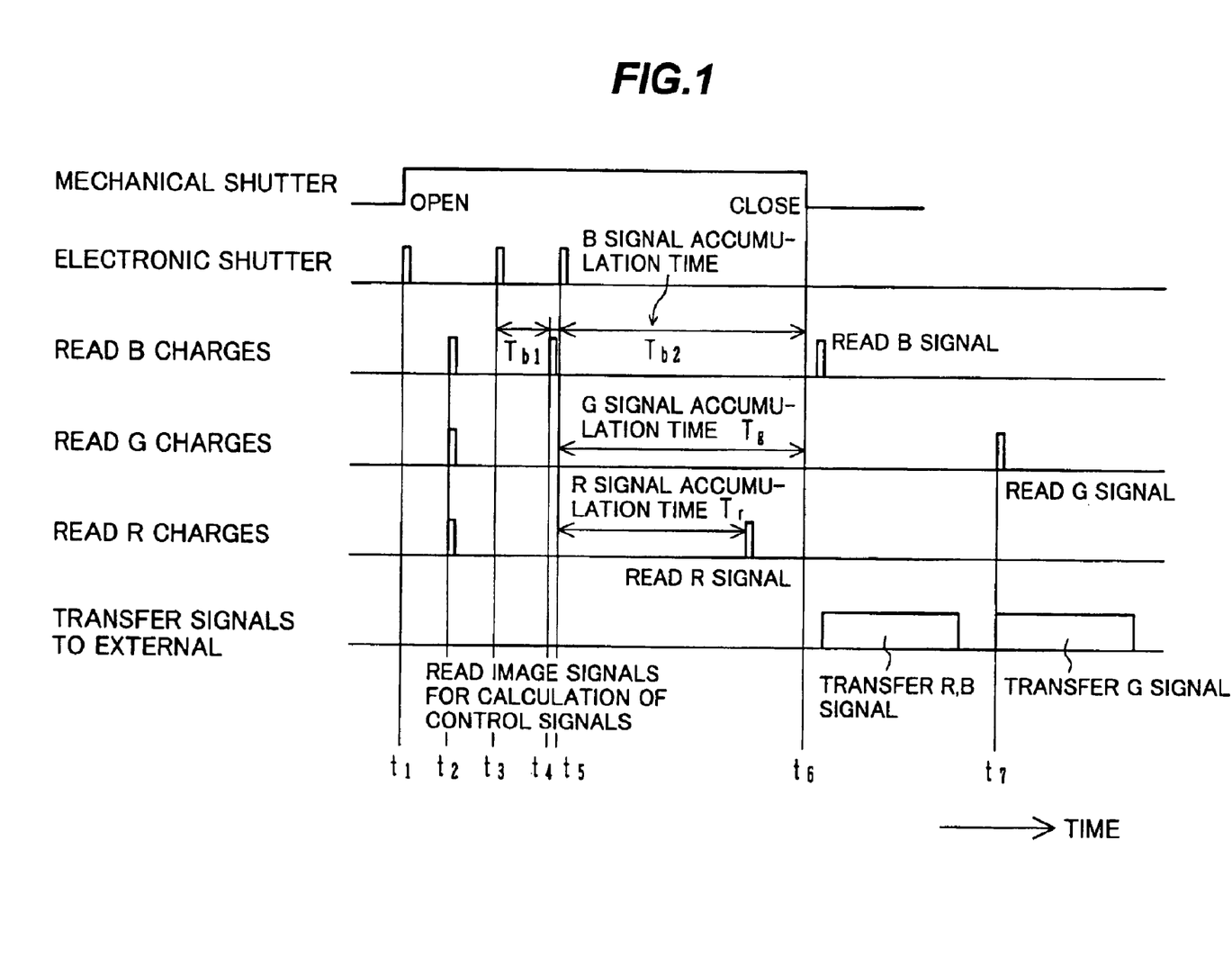
FIG. 1 is a timing chart illustrating an operation of a solid state image pickup device according to an embodiment of the invention.

FIG. 1 is a timing chart illustrating the image pickup operation of a solid state image pickup device according to an embodiment of the invention.

As a preliminary trial image pickup (tentative image pickup) stage, the mechanical shutter 11 is opened. Thereafter, an electronic shutter pulse is supplied at time $t_1$ to clear electric charges in all photodiodes 2. This electronic shutter pulse supplied at time $t_1$ initializes all the photodiodes 2 and starts the exposure time (charge accumulation time). At time $t_2$, a charge read pulse is applied to the transfer gates 4 corresponding to the photodiodes (pixels) 2 of all colors to read electric charges in the RGB photodiodes 2 to the vertical charge transfer paths 3. Each vertical charge transfer path 3 transfers the electric charges downward in the vertical direction. The horizontal charge transfer path 6 receives the electric charges from the vertical charge transfer paths and transfers the electric charges right in the horizontal direction. The output amplifier 7 outputs RGB signals obtained by the tentative image pickup.

Next, as a calculation stage, by using the RGB signals obtained by the tentative image pickup, the calculation unit 9 calculates the charge accumulation time independently for each of RGB pixels in order to obtain a good white balance of an image to be reproduced. This calculation method will be described with reference to FIG. 2.

Figure 2:
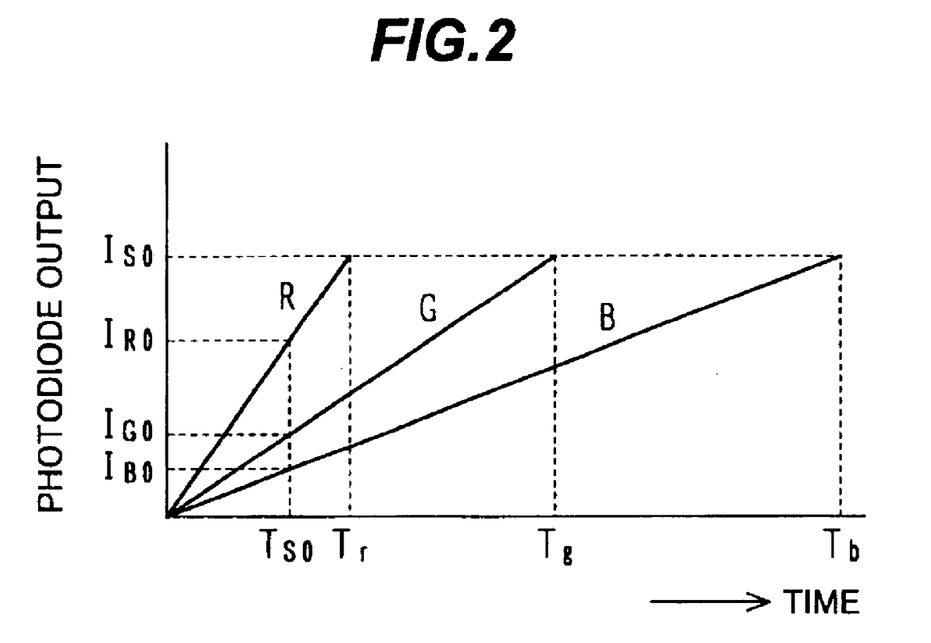
FIG. 2 is a graph showing a photodiode output relative to a charge accumulation time of each color pixel.

In FIG. 2, the abscissa represents a charge accumulation time (exposure time) and the ordinate represents a photodiode output (accumulated charge amount) corresponding to the intensity of light received by a photodiode. The tentative image pickup is performed at an exposure time of $T_{SO}(t_2-t_1)$, and light intensities $I_{RO}$, $I_{GO}$ and $I_{BO}$ of RGB colors can be obtained by adding electric charges accumulated in the photodiodes of each color.

Optimum charge accumulation times Tr, Tg and Th of RGB colors can be calculated from the following equations:

$$Tr = T_{SO} \times (I_{SO}/I_{RO}) \times k$$

$$Tg = T_{SO} \times (I_{SO}/I_{GO}) \times k$$

$$Tb = T_{SO} \times (I_{SO}/I_{BO}) \times k$$

where Tr, Tg and Tb represent optimum charge accumulation times of red, green and blue pixels, Iso represents a saturated light intensity, and $I_{RO}$, $I_{GO}$ and $I_{BO}$ represent detected light intensities (accumulated charges) of red, green and blue colors, and k represents an adequate gain.

Next, the final image pickup is performed. At time $t_3$, an electronic shutter pulse is applied to the substrate 1 to clear electric charges of all the photodiodes 2. This electronic shutter pulse starts a first exposure time of photodiodes.

If the calculation results are Tr<Tg<Tb, at time $t_4$ after a lapse of about Tb−Tg, a B signal read pulse is supplied to the transfer gates 4 of the blue pixels. Conversely, if the calculation results are Tr>Tg>Tb, at time $t_4$ after a lapse of about Tr−Tg, an R signal read pulse is supplied to the transfer gates 4 of the red pixels. The former case corresponds to the timing chart shown in FIG. 1. At time $t_4$, B signals are read to the vertical charge transfer paths 3. This read operation terminates the first exposure time Tb1 for B photodiodes. The first exposure time Tb1 is a time duration from time $t_3$ to time $t_4$.

After the B signal is read, an electronic shutter pulse is supplied at time $t_5$ to reset or drain electric charges in all the photodiodes to the substrate 1. This reset starts a second exposure time Tb2 of B pixels, an exposure time Tg for G pixels and an exposure time Tr for R pixels.

After the lapse of the exposure time Tr from time $t_5$, an R pixel read pulse is supplied to read R signals from the R photodiodes 2 to the vertical charge transfer paths 3. This read operation terminates the exposure time Tr.

Next, at time $t_6$ after the lapse of the exposure time Tg (=Tb$_2$) after the reset timing $t_5$, the mechanical shutter is closed to shield light incident upon the photodiodes 2. At time $t_6$, the exposure times Tg and Tb2 are terminated. The exposure times Tg and Tb2 are the time durations from time $t_5$ to time $t_6$.

The exposure time Tb for B pixels is a total of the first exposure time Tb1 and the second exposure time Tb2. The exposure time for G pixels is Tg and the exposure time for R pixels is Tr.

At time $t_6$, the electric charges during the second exposure time Tb2 for B pixels remain in the photodiodes and the electric charges during the first exposure time Tb1 for B pixels remain in the vertical charge transfer paths 3. The electric charges during the exposure time Tg for G pixels remain in the photodiodes 2. The electric charges during the exposure time Tr for R pixels remain in the vertical charge transfer paths 2.

Next, a B pixel read pulse is supplied to read B signals from the photodiodes 2 to the vertical charge transfer paths 3. This read operation adds (mixes) the electric charges already stored in the vertical charge transfer paths 3 during the first exposure time Tb1 to (with) the electric charges read to the vertical charge transfer paths 3 during the second exposure time Tb2. The electric charges for R pixels during the exposure time Tr have already been read to the vertical charge transfer paths 3.

Next, R and B electric charges (signals) on the vertical charge transfer paths 3 are transferred downward in the vertical direction in FIG. 5A. The horizontal charge transfer path 6 transfers the R and B signals received from the vertical charge transfer paths 3 in the horizontal direction. The output amplifier 7 outputs the electric charges as voltage signals to the external.

Next, at time $t_7$, a G pixel read pulse is supplied to read G signals from the photodiodes to the vertical charge transfer paths 3. Thereafter, the G signals on the vertical charge transfer paths 3 are transferred downward in the vertical direction in FIG. 5A. The horizontal charge transfer path 6 transfers the G signals received from the vertical charge transfer paths 3 in the horizontal direction. The output amplifier 7 outputs the G electric charges as voltage signals to the external.

With the processes described above, the exposure times Tr, Tg and Tb for R, G and B signals can be controlled independently, and RGB pixel signals having a good white balance can be obtained.

Figure 3:
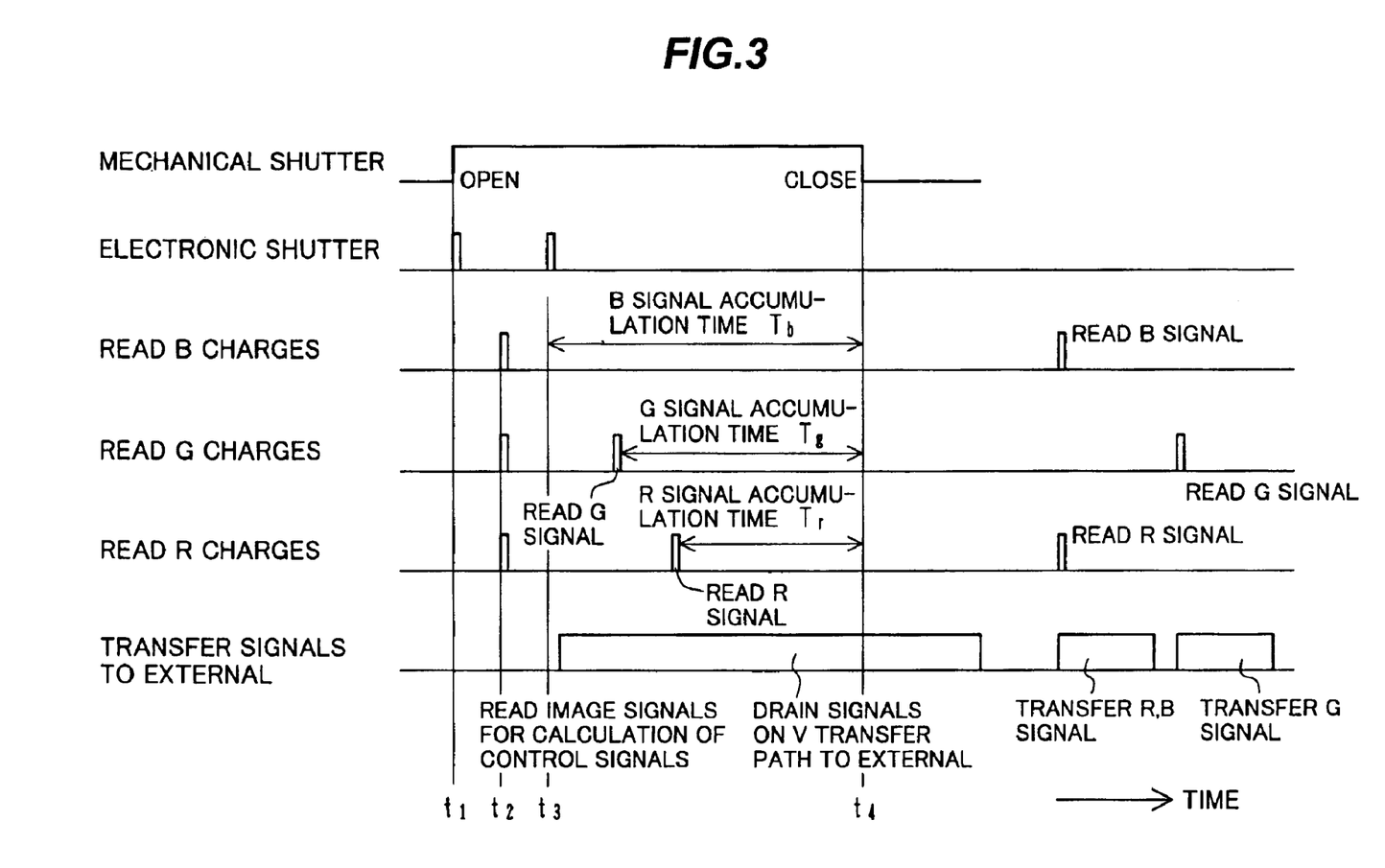
FIG. 3 is a timing chart illustrating an operation of a solid state image pickup device according to another embodiment of the invention.

Next, an image pickup operation of a solid state image pickup device according to another embodiment of the invention will be described with reference to the timing chart shown in FIG. 3.

As the preliminary trial image pickup (tentative image pickup) stage, the mechanical shutter is opened. Thereafter, an electronic shutter pulse is supplied at time $t_1$ to reset all photodiodes 2. This reset starts accumulating the electric charges in the photodiodes of all pixels. At time $t_2$, a charge read pulse is generated to read electric charges of RGB pixels from the photodiodes 2 to the vertical charge transfer paths 3.

Next, as the calculation stage, by using the electric charges of RGB pixels obtained by the preliminary trial image pickup stage, the charge accumulation time is calculated for each group of RGB pixels in order to obtain a good white balance of an image to be reproduced. The above processes are same as the first embodiment.

Next, the final image pickup stage is performed. It is assumed that the calculation results are Tr<Tg<Tb. First, at time $t_3$ an electronic shutter pulse is supplied to reset all photodiodes 2. This reset starts an exposure time for B pixels.

Next, after a lapse of Tb−Tg from the time $t_3$, a G signal read pulse is supplied to read unnecessary G signals from the G pixel photodiodes 2 to the vertical charge transfer paths 3. This read operation resets the G pixel photodiodes 2 and starts an exposure time Tg. The unnecessary G pixel electric charges read to the vertical charge transfer paths 3 are transferred upward in the vertical direction shown in FIG. 5A and drained to the drains 10.

After a lapse of Tb−Tr from time $t_3$, an R signal read pulse is supplied to read unnecessary R signals from the R pixel photodiodes 2 to the vertical charge transfer paths 3. This read operation resets the R pixel photodiodes 2 and starts an exposure time Tr. The unnecessary R pixel electric charges read to the vertical charge transfer paths 3 are transferred upward in the vertical direction shown in FIG. 5A and drained to the drains 10.

Next, at time $t_4$ after the lapse of an exposure time Tb after time $t_3$, the mechanical shutter is closed. At time $t_4$, the exposure times Tb, Tg and Tr are terminated. After all the unnecessary G and R signals on the vertical charge transfer paths 3 are drained to the drains 10, B and R pixel read signals are supplied to read B and R signals from the photodiodes 2 to the vertical charge transfer paths 3.

The vertical charge transfer paths 3 transfer the B and R signals downward in the vertical direction shown in FIG. 5A. The horizontal charge transfer path 6 transfers the B and R signals in the horizontal direction, and the output amplifier 7 outputs voltage signals corresponding to the B and R signals to the external.

Next, a G pixel read pulse is supplied to read G signals from the photodiodes 2 to the vertical charge transfer paths 3. The vertical charge transfer paths 3 transfer the G signals downward in the vertical direction shown in FIG. 5A. The horizontal charge transfer path 6 transfers the G signals in the horizontal direction, and the output amplifier 7 outputs voltage signals corresponding to the G signals to the external.

With the processes described above, the exposure times Tr, Tg and Tb for R, G and B signals can be controlled independently, and RGB pixel signals having a good white balance can be obtained.

In the first and second embodiments, it is assumed that the calculation results are Tb>Tg>Tr. The embodiments are also applicable to the calculation results of Tb<Tg<Tr. In this case, the control operations for B and R pixels are reversed.

Figure 4:
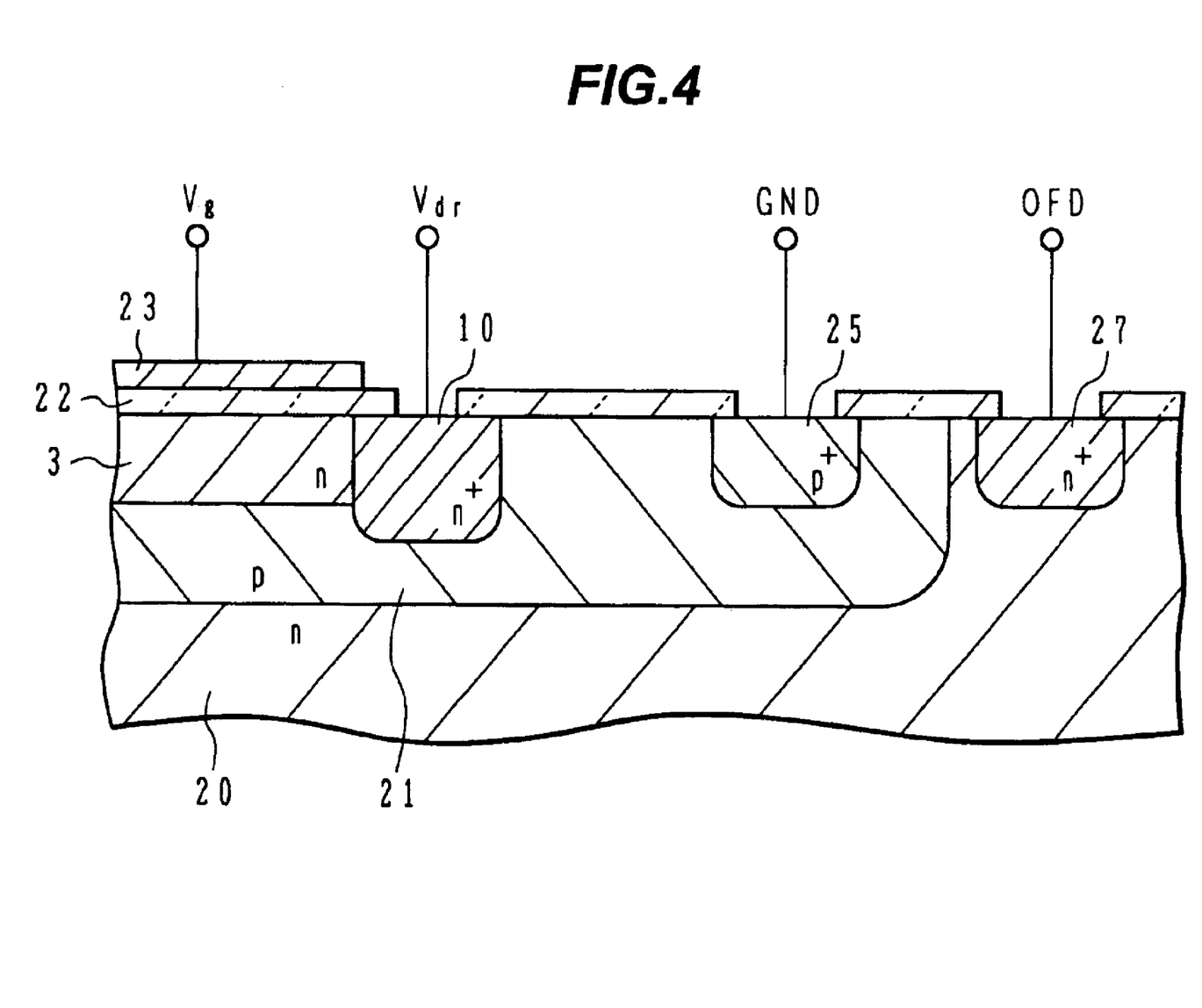
FIG. 4 is a cross sectional view of a semiconductor substrate having a drain for draining electric charges from a vertical charge transfer path to the external.

FIG. 4 is a cross sectional view taken along line IV—IV shown in FIG. 5A and showing the drain 10. In a p-type semiconductor region 21 in an n-type Si substrate 20, an n-type semiconductor region (vertical charge transfer path) 3 and an $n^+$-type semiconductor region (drain) 10 are formed. A positive potential Vdr is applied to the $n^+$-type semiconductor region 10. A conductive film (polysilicon film) 23 is formed on an insulating film 22 above the n-type semiconductor region 3. A gate voltage Vg is applied to the conductive film 23. As a positive potential is applied as the gate voltage Vg, electric charges on the vertical charge transfer path 3 are transferred and then drained to the drain 10 at the positive potential Vdr.

A $p^+$-type electrode region 25 is formed in the surface layer of the p-type region 21, and connected to a ground terminal GND. An $n^+$-type electrode region 27 is formed in the surface layer of the n-type substrate 20, and connected to an overflow drain/electronic shutter terminal OFD. By applying a selected high voltage to the terminal OFD, the potential barrier formed by the p-type region 21 under the photodiode 2 (FIG. 1) can be extinguished and electric charges in the photodiode 2 can be drained to the substrate 20.

The present invention has been described in connection with the preferred embodiments. The invention is not limited only to the above embodiments. It will be for those skilled in the art apparent that various modifications, improvements, combinations, and the like can be made.

What is claimed is:

1. A control method for a solid state image pickup device having a plurality of photoelectric conversion elements, each of the photoelectric conversion elements being of a type for converting light of each of a plurality of colors into electric charges, a charge read-out region disposed in a column adjacent to each of the photoelectric conversion elements, charge transfer paths disposed adjacent to each column of the charge read-out regions, a mechanical shutter for opening and closing a path of incident light to the plurality of photoelectric conversion elements, and an electronic shutter for clearing electric charges in each of the plurality of photoelectric conversion elements, in which said photoelectric conversion elements, charge read-out regions, charge transfer paths, and electronic shutter are integrated in one semiconductor chip and provided with color filters disposed above said photoelectric conversion elements, the control method comprising:

a preliminary trial image pickup step of forming a preliminary trial image on the semiconductor chip to let the plurality of photoelectric conversion elements generate and accumulate electric charges during a predetermined charge accumulation time and detecting a charge amount corresponding to an intensity of light of each color;

a calculation step of calculating a charge accumulation time of photosensitive conversion elements independently for each color so as to obtain a good white balance, in accordance with the charge amount corresponding to the intensity of light of each color detected by said preliminary trial image pickup step; and a final image pickup step of controlling the charge accumulation time of photosensitive conversion elements independently for each color by using the electronic shutter, the mechanical shutter and read-out of electric charges from the photoelectric conversion elements to the charge transfer paths, in accordance with the calculated charge accumulation times, and forming a final image on the semiconductor chip to let the plurality type of photoelectric conversion elements generate and accumulate charges.

2. A control method for a solid state image pickup device according to claim 1, wherein said charge read-out regions are capable of transferring electric charges in the photoelectric conversion elements to said charge transfer paths, the plurality type of photoelectric conversion elements are capable of converting light of at least first to third colors into electric charges, and said final image pickup step comprises the steps of:

(a) starting a first charge accumulation time for the first color by the electronic shutter;

(b) reading electric charges from the photoelectric conversion elements of the first color to the charge transfer paths to terminate the first charge accumulation time of the first color;

(c) starting a second charge accumulation time for the first color, a charge accumulation time for the second color and a charge accumulation time for the third color by the electronic shutter;

(d) reading electric charges from the photoelectric conversion elements of the third color to the charge transfer paths to terminate the charge accumulation time for the third color; and (e) closing the mechanical shutter to terminate the charge accumulation time for the first color and the charge accumulation time for the second color.

3. A control method for a solid state image pickup device according to claim 2, further comprising the steps of:

(f) reading electric charges from the photoelectric conversion elements of the first color to the charge transfer paths;

(g) transferring the electric charges for the first and third colors on the charge transfer paths;

(h) reading electric charges from the photoelectric conversion elements of the second color to the charge transfer paths; and (i) transferring the electric charges for the second color on the charge transfer paths.

4. A control method for a solid state image pickup device according to claim 1, wherein said charge read-out regions are capable of transferring electric charges in the photoelectric conversion elements to said charge transfer paths, the plurality type of photoelectric conversion elements are capable of converting light of a least first to third colors into electric charges, and said final image pickup step comprises the steps of:

(a) starting a first charge accumulation time for the first color by the electronic shutter;

(b) reading unnecessary electric charges form the photoelectric conversion elements of the second color to the charge transfer paths to initiate a charge accumulation time of the second color;

(c) reading unnecessary electric charges from the photoelectric conversion elements of the third color to the charge transfer paths to initiate a charge accumulation time of the third color; and (d) closing the mechanical shutter to terminate the first, second and third charge accumulation times.

5. A control method for a solid state image pickup device according to claim 4, further comprising the steps of:

(e) draining the unnecessary charges for the second and third colors read to the charge transfer paths;

(f) reading electric charges from the photoelectric conversion elements of the first and third colors to the charge transfer paths;

(g) transferring the electric charges for the first and third colors on the charge transfer paths;

(h) reading electric charges from the photoelectric conversion elements of the second color to the charge transfer paths; and (i) transferring the electric charges for the second color on the charge transfer paths.

6. A control method for a solid state image pickup device according to claim 2 or 4, wherein said first, second, and third colors are blue, green, and red, respectively.

7. A control method for a solid state image pickup device according to claim 2 or 4, wherein said first, second, and third colors are red, green, and blue, respectively.

8. A solid state image pickup device comprising:

a semiconductor substrate;

color filters of red, green, and blue disposed above the semiconductor substrate;

a plurality type of photoelectric conversion elements for converting light of each of red, green and blue colors into electric charges, formed in the semiconductor substrate, the photoelectric conversion elements being disposed in vertical and horizontal directions in a two-dimensional plane;

vertical charge transfer paths for transferring electric charges in the vertical direction, formed in the semiconductor substrate;

read gates for reading electric charges from the photoelectric conversion elements to the vertical charge transfer paths, formed between said photoelectric conversion elements and said vertical charge transfer paths;

a horizontal charge transfer path disposed adjacent to one end of each of the vertical charge transfer paths for transferring electric charges transferred from said vertical charge transfer paths in the horizontal direction;

an electronic shutter formed in said semiconductor substrate for clearing electric charges in the plurality type of photoelectric conversion elements;

preliminary trial image pickup means for forming a preliminary trial image on the semiconductor substrate to let the plurality type of photoelectric conversion elements generate and accumulate electric charges during a predetermined charge accumulation time and detecting a charge amount corresponding to an intensity of light of each color;

calculation mean for calculating a charge accumulation time of photoelectric conversion elements independently for each color so as to obtain a good white balance, in accordance with the charge amount corresponding to the intensity of light of each color detected by said preliminary trial image pickup means; and final image pickup means for controlling the charge accumulation time of photoelectric conversion elements independently for each color by using said electronic shutter, a mechanical shutter, and read-out of electric charges from the photoelectric conversion elements to said vertical charge transfer paths, in accordance with the calculated charge accumulation times, and forming a final image on the semiconductor substrate to let the plurality type of photoelectric conversion elements generate and accumulate electric charges.

* * * * *